US006577268B1

(12) United States Patent
Mustard et al.

(10) Patent No.: US 6,577,268 B1
(45) Date of Patent: Jun. 10, 2003

(54) OUTBOARD RADIO SIGNAL TEST SYSTEM AND METHOD

(75) Inventors: Joseph P. Mustard, Chesapeake, VA (US); Diem-Trang T. Le, Virginia Beach, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/176,295

(22) Filed: Jun. 20, 2002

(51) Int. Cl.[7] .......................... H01Q 3/00; G01R 29/10

(52) U.S. Cl. ...................... 342/174; 342/165; 342/173; 342/360; 342/195; 343/703; 343/709; 343/710

(58) Field of Search .......................... 342/41, 165–175, 342/192–197, 360, 385, 386–449; 343/703, 709, 710; 455/67.1–67.7

(56) References Cited

U.S. PATENT DOCUMENTS 3,879,733 A * 4/1975 Hansen et al. .............. 342/360
4,488,155 A * 12/1984 Wu ............................ 342/174
4,754,496 A * 6/1988 Fishkin et al. .............. 343/703
4,884,078 A * 11/1989 Fishkin et al. .............. 342/360
5,371,508 A * 12/1994 Teich et al. ................. 343/703
5,396,255 A * 3/1995 Durkota et al. ............. 342/360
6,313,799 B1 * 11/2001 Thimm et al. .............. 343/703

* cited by examiner

*Primary Examiner*—Bernarr E. Gregory
(74) *Attorney, Agent, or Firm*—James M. Kasischke; Michael F. Oglo; Jean-Paul A. Nasser

(57) ABSTRACT

The present invention provides an outboard test facility that is operable for testing a ship's direction finding antenna system in all directions as the ship circles while receiving test signals from the outboard test facility. The test facility provides a computer control operable for monitoring and storing signal power produced by any selected patch interconnections between a plurality of antennas, a plurality of radio frequency amplifiers and a plurality of signal generators at the outboard test facility. The computer control permits a single operator to monitor a signal analyzer to determine the optimum signal power for each of a list of signal frequencies to be broadcast to the ship based on the selected patch interconnection.

17 Claims, 2 Drawing Sheets

OUTBOARD RADIO SIGNAL TEST SYSTEM AND METHOD

STATEMENT OF THE GOVERNMENT INTEREST

The invention described herein may be manufactured and used by or for the Government of the United States of America for Governmental purposes without the payment of any royalties thereon or therefore.

CROSS REFERENCE TO OTHER PATENT APPLICATIONS

Not applicable.

BACKGROUND OF THE INVENTION (1). Field of the Invention

The present invention relates generally to systems and methods for calibrating shipboard radio equipment and, more particularly, to a computerized outboard test facility to automate ship radio system test planning and operation.

(2). Description of the Prior Art

In order to test and calibrate a ship's radio direction finding antennas and/or other testing, an outboard test facility is maintained having a plurality of antennas to generate, in most cases, a large number of different frequencies required by the ship. The tests are quite time consuming and may require up to two days of testing while the ship circles. It would be desirable to make the testing as efficient as possible because the ship normally has numerous duties and time is critical. The outboard test facility has to coordinate the testing schedules of numerous ships, the agents such as in-service engineering agents who monitor accurate completion of tests, and the facility's own testing schedule. Extensive system checks and grooms are typically required. Pre-test briefings are required to set up all the testing requirements. Thus, it is highly desirable that testing proceeds as quickly as possible and without equipment failure.

The ship is required to perform a circular maneuver around a buoy or geodetic point of reference. The maneuver is required to be as circular as possible with the same angular velocity (constant turn rate). The number of measurements per quadrant, number of frequencies, and other factors will determine rudder angle and turning speed.

In the past, for each frequency, a test facility operator would need to set the bandwidth of the antennas to be used, make the physical connections between the signal source, amplifier and antennas and gradually increase the amplifier gain until the signal power output is maximized. At least two facility operators were required, one to control the signal generator/amplifier and one to read the spectrum analyzer to determine the optimum setting. Once set, the ship would verify it was receiving the signal and would commence its calibration for that frequency. Once calibrated, the process would be repeated for each frequency to be calibrated. The signal generator/amplifier settings for each frequency could be saved in hand written logs. However, due to the large number of frequency calibrations, which may typically be on the order of two hundred and fifty, the potential for log-in errors was high. Initial setting errors could lead to equipment failure if the system were brought on line at too high a power level. Therefore operators in the past have preferred to power up gradually, taking more time rather than relying on written logs, to avoid the risk of the possibility of equipment damage that would require the more extensive time for repairs and possibly create significant time requirement problems.

Various inventors have attempted to solve related problems as evidenced by the following patents, without providing the solutions taught hereinafter.

U.S. Pat. No. 4,884,078 issued Nov. 28, 1989, to Fishkin et al, discloses an improved antenna test and measurement system including a transmit antenna; means for providing a test signal to said transmit antenna and initiating the transmission thereof; a receive antenna adapted to receive the test signal as transmitted by said transmit antenna; an amplitude detector for detecting the amplitude of the received test signal; and an open loop phase detector for measuring the phase of the received test signal relative to a reference signal U.S. Pat. No. 5,371,508, issued Dec. 6, 1994, to Teich et al., discloses a portable antenna test apparatus to provide a test set positioned a determined distance from a number of antennas of an aircraft. A transmitting module of the test set contains low frequency, mid frequency, and high frequency antennas connected to a radio receiver and power amplifier in and of the test set for receiving control commands and for transmitting a number of simultaneous test signals to the number of antennas in the aircraft. A signal generator produces low frequency, mid frequency and high frequency signals. A hand-held computer is connected to a communications radio in and of the aircraft via a radio interface adapter of the hand-held computer and a control computer is connected to the signal generator. The hand-held computer transmits commands via the aircraft radio, which commands are received by the receiver in the transmitting module. This receiver conveys the commands to the control computer which then programs the signal generator. By this means, an operator in the aircraft cockpit remotely controls the signal generator.

U.S. Pat. No. 5,396,255, issued Mar. 7, 1995, to Durkota et al., discloses an antenna test and measurement system that performs measurements of the transmitted or received signal strength of a vehicle mounted transmit or receive antenna with respect to all aspects of the system with respect to the vehicle mounted antenna, and vehicle state parameters, i.e., position and attitude, are simultaneously recorded. The antenna measurements are correlated with the state parameter measurements such that variations in the measured signal strength caused by changes in vehicle state are apparent. A graphical display of antenna signal strength and vehicle state parameters are presented for the entire 360 degree azimuth of an antenna test so that variations in the signal strength caused by changes in vehicle state parameters may be identified. The graphical display of antenna signal strength may be modified based on variations in vehicle state parameters such that the graphical display indicates the antenna signal strength had the variations in vehicle state not occurred. Antenna signal strength data and vehicle state information is telemetered from the vehicle carrying the antenna to the antenna test and measurement system. A graphical display of antenna signal strength versus antenna altitude is provided for determining the optimum altitude for antenna pattern measurements, and calculation of antenna isotropic is provided for verification of antenna performance.

U.S. Pat. No. 6,313,799, issued Nov. 6, 2001, to Thimm et al., discloses a diagnostic device having a diversity processor for individually testing the electrical condition of the connections of individual antennas of a multi-antenna system in a motor vehicle. This device can be coupled to the interfaces of an antenna amplifier containing a diversity system, and such a test can be carried out without any intervention in the circuitry of the receiving installation. The diagnostic device contains a test unit and a control unit. The test unit is designed for generating a test signal that is received by an antenna of the multi-antenna system by a transmitting antenna. The diversity system is acted upon by a control unit having a control signal consisting of an IF-signal and a dc voltage signal. The control signal generated by the control unit by an interference simulator integrated in the control unit is disturbed only when the diversity system is prompted to switch to the next antenna. The received power measured by the test unit on the output of the antenna amplifier can be antenna-specifically detected, stored and evaluated.

The above patents do not disclose a system and method for operable for controlling a plurality of test antennas with respect to planning a test program, repeating power up routines, and associated data analysis.

SUMMARY OF THE INVENTION

Accordingly, it is an objective of the present invention to provide an improved system and method for testing shipboard direction finding antenna systems.

Another objective is to provide a system and method as aforesaid which may be utilized to more efficiently control power settings of offboard antenna systems.

A further objective is to provide a system and method as aforesaid whereby computer controls may be utilized to safely power up a selectable associated patch interconnection of signal transmitting equipment and/or repeat power settings.

These and other objectives, features, and advantages of the present invention will become apparent from the drawings, the descriptions given herein, and the appended claims. However, it will be understood that the above listed objectives and advantages of the invention are intended only as an aid in understanding aspects of the invention, and are not intended to limit the invention in any way, and do not form a comprehensive list of objectives, features, and advantages.

Accordingly, the present invention provides a method for testing a ship direction finding antenna system for a client ship by utilizing an outboard facility while the client ship maneuvers around the circular course disposed in a predetermined position relative to the outboard facility. The method comprises one or more steps such as, for instance, entering into a memory of the outboard facility a list of radio frequency signals which the client ship desires in order for the client ship to test the ship direction finding antenna system and determining a test plan for transmitting a plurality of test signals comprising the list of radio frequency signals from the outboard facility with respect to the client ship and the circular course. Other steps may comprise making at least one patch interconnection between a selected of a plurality of signal generators of the outboard facility, a selected of a plurality of radio frequency amplifiers of the outboard facility, and a selected of the plurality of antennas at the outboard facility, wherein the at least one patch interconnection is operable for producing the list of radio frequency signals. Additional steps may comprise providing a computer screen with visual indicators to indicate a power setting for power control of the at least one patch interconnection, utilizing the visual indicators to increase a signal power produced by the at least one patch interconnection while monitoring a spectrum analyzer to produce an optimum signal power for each of the plurality of frequencies, and/or storing the optimum signal power for each of the plurality of frequencies with respect to the at least one patch interconnection. The method may further comprise contacting the client ship and broadcasting the list of frequencies utilizing the stored optimum power signals.

In a preferred embodiment, the computer screen displays details of the at least one patch interconnection and/or the computer screen displays a slide bar for indicating a level of the signal power.

The method may further comprise entering into the memory of the outboard facility a selected bandwidth for the list of radio frequencies and/or entering into the memory of the outboard facility a list of the plurality of antennas, the plurality of radio frequency amplifiers, and the plurality of signal generators. Preferably the invention further comprises providing that the test plan is optimized to reduce the amount of circling required by the client ship. In a presently preferred embodiment, the method comprises matching frequencies available from the plurality of signal generators to the list of frequencies and/or automatically generating the test plan. The method may further comprise selectively editing the automatically generated test plan.

Thus, the invention provides for an outboard facility for use with a client ship when calibrating a ship direction finding antenna system as the client ship maneuvers around a circular course. The outboard facility comprises a plurality of signal generators operable for producing generated signals at a plurality of frequencies and a plurality of radio frequency amplifiers with variable gains for amplifying the generated signals wherein the plurality of radio frequency amplifiers may be selectively interconnectable with each of the plurality of signal generators. Additional elements comprise a plurality of antennas wherein the plurality of antennas may be selectively interconnectable with each of the plurality of radio frequency amplifiers. A spectrum analyzer is operable for monitoring the plurality of antennas. A computer control is operable for storing the list of frequencies to be broadcast. The computer control may also be operable for storing a selected patch interconnection of one or more of the plurality of signal generators to one or more of plurality of radio frequency amplifiers and to one or more of the plurality of antennas. A computer screen is preferably provided with a visual indicator for a power level of the selected patch interconnection. The visual indicator may be selectively controllable by an operator for producing an optimum signal power as determined by the spectrum analyzer for the list of frequencies. The computer control is operable for storing the optimum signal power for the list of frequencies.

The computer control is operable for storing the test plan to broadcast the list of frequencies while the client ship maneuvers around a circular course. The computer control is preferably operable for storing data related to capabilities of the plurality of signal generators, the plurality of radio frequency amplifiers, and the plurality of antennas. In one embodiment, the computer control is operable for producing the test plan by matching the list of frequencies with the capabilities of the plurality of signal generators, the plurality of radio frequency amplifiers, and the plurality of antennas. The computer control is further operable for storing a test plan for one or more succeeding patch interconnections. Each succeeding patch interconnection is operable to broadcast at least one different frequency of the list of desired test frequencies. The computer control is preferably still further operable to automatically broadcast at least one frequency for each of a plurality of selected succeeding patch interconnections utilized during corresponding succeeding circular maneuvers of the client ship.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawing wherein corresponding reference characters indicate corresponding parts throughout several views of the drawings and wherein.

DESCRIPTION OF THE PREFERRED EMBODIMENTS

Figure 1:
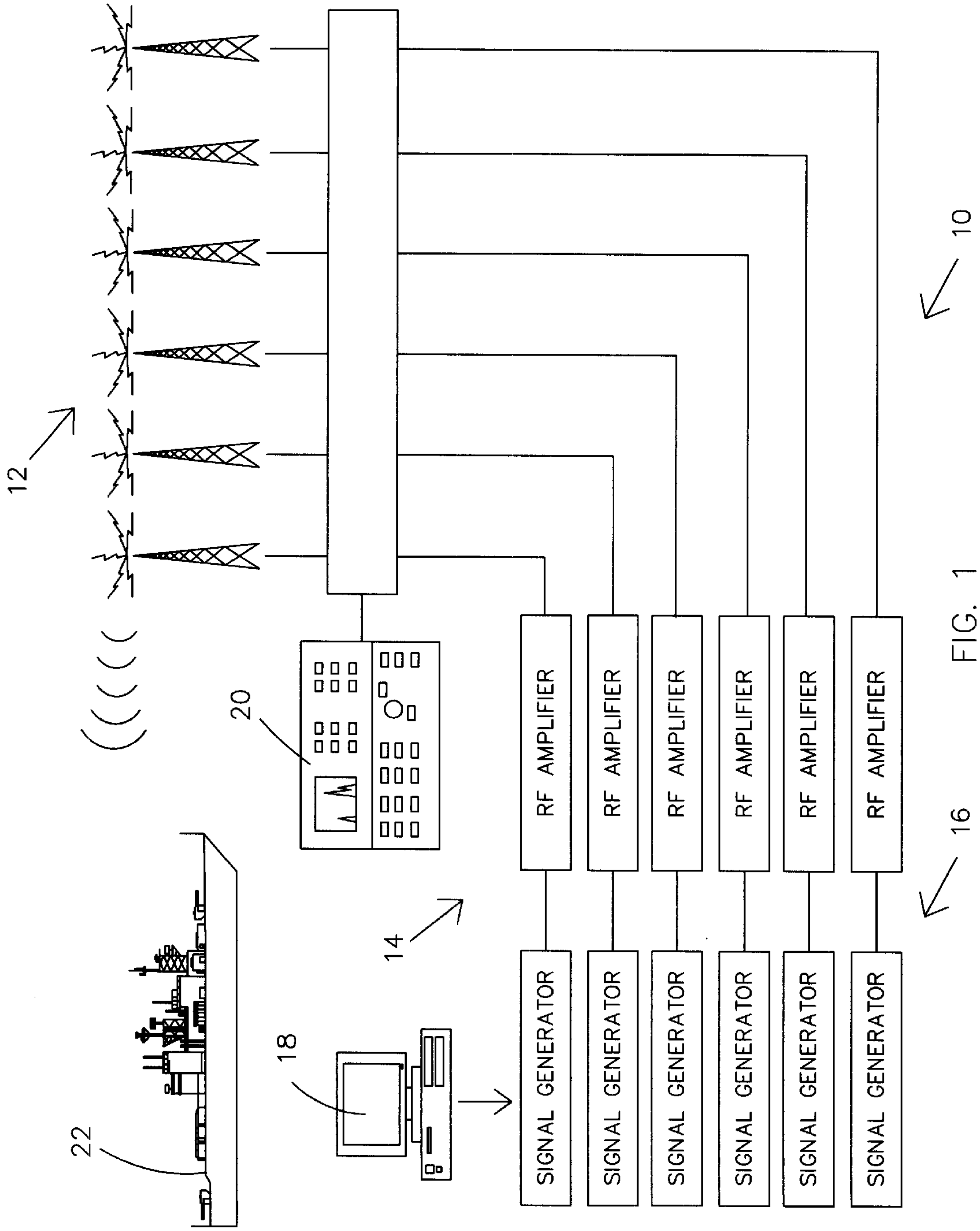
FIG. 1 is a schematic diagram showing a typical test set up for radio direction finding calibration in accord with the present invention.

Referring now to the drawings and, more particularly to FIG. 1, there is shown outboard system or facility 10, which may be used for testing a ship's antenna system. Outboard system 10 may include a plurality of antennas 12, a plurality of radio frequency (RF) amplifiers 14, a plurality of signal generators 16, a computer control 18, and one or more spectrum analyzers 20.

Figure 3:
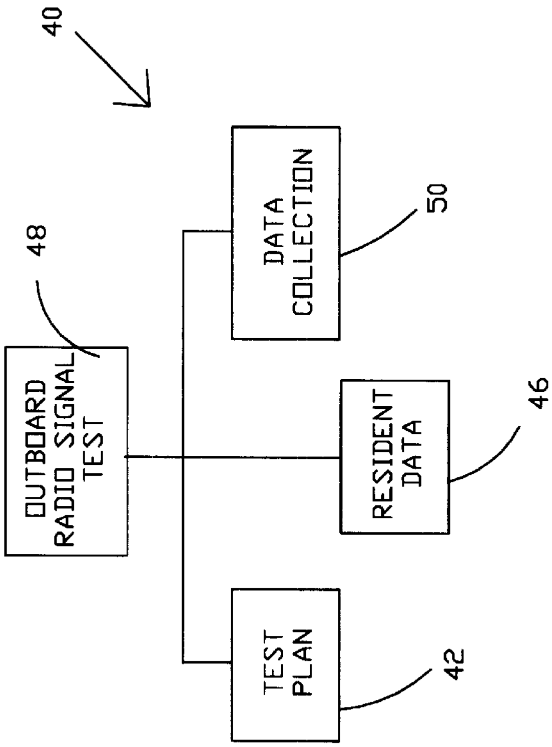
FIG. 3 is a computer block diagram that illustrates basic software component organization of an outboard radio signal test system in accord with the present invention.

In FIG. 1, outboard system 10 is set up to transmit frequencies for testing the direction finding antennas of ship 22 by utilizing, typically, a plurality of signals broadcast by plurality of antennas 12. The ship provides a listing of frequencies for calibration. Based on the range of frequencies and employing prior knowledge data concerning bandwidth capabilities of RF amplifiers 14, an operator sets the bandwidths for the available antennas 12. The data concerning bandwidth capabilities of RF amplifiers 14 is part of resident data 46, FIG. 3, of software computer control 40, FIG. 3, to be further discussed later herein. The bandwidths and frequencies are input to computer 18. Utilizing this information, computer 18 may be used to generate a test plan using test plan software module 42, as indicated in FIG. 3, that makes efficient use of the antennas, such as plurality of antennas 12, and the bandwidths of the signal frequencies to be calibrated. The test plan may also be manually generated, if desired. The test plan includes a number of runs, or circling maneuvers, for ship 22 where each run is described in terms of the signals to be broadcast from antennas 12.

The computer generated test plan can be modified/edited by the facility operator of outboard system 10 using test plan maintenance features which may be provided in test plan module 42. Preferably, test plan module 42 also provides that computer 18 monitors edits made by the facility operator to make sure the edited plan conforms to the previously set antenna bandwidths and provides an error signal if the edited program no longer conforms.

Based on the so-determined test plan, and based on data residing in computer 18 related to plurality of antennas 12, plurality of RF amplifiers 14, and signal generators 16, computer 18 generates a set of patches, or actual physical connections between these system components that will allow the required frequencies to be broadcast from antennas 12 to ship 22. In a presently preferred embodiment, the patches or actual physical connections are made by an operator.

Figure 2:
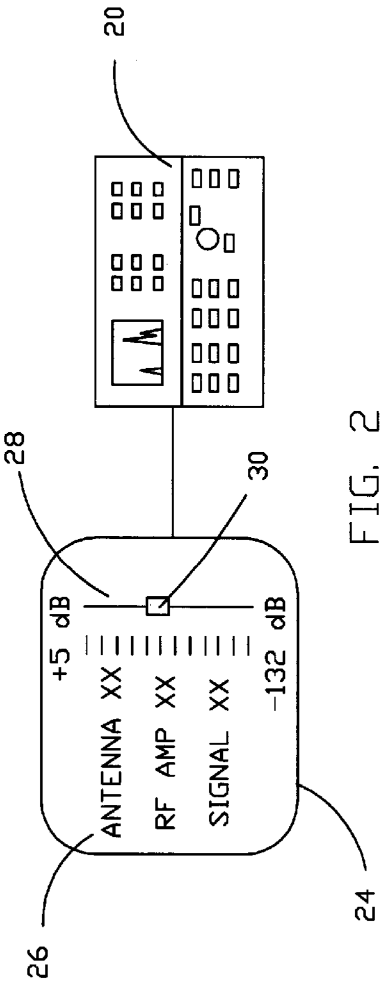
FIG. 2 is a schematic showing a computer display and spectrum analyzer which may be monitored by an operator in accord with the present invention.

To bring a system up to power, the operator activates a power up routine during which the operator chooses the run and the selected of antennas 12 to be powered up from the test plan. A power screen, such as computer screen 24 shown in FIG. 2 is displayed which preferably shows antenna/patch data 26 for the signal chosen as well as a mouse activated power indicator 28. The initial setting of the power, as indicated by the position of slide bar 30 along power indicator 28 would typically be input as part of facility data as indicated at module 46. Computer 18 is tied into signal generators 16 and RF amplifiers 14 so that choosing the run and antennas activates the patch, or the particular signal generator(s) and RF amplifier(s) utilized, for the chosen test. By moving slide bar 30 up or down, the operator changes the signal power level and can monitor antenna output utilizing spectrum analyzer 20 which preferably provides a display adjacent computer screen 24 as indicated in FIG. 2. While a presently preferred computer screen of the invention utilizes a slide bar control, other types of visual computer controls may be utilized from computer screen and the visual controls may be operated by keyboard, mouse, or other input devices as desired.

Spectrum analyzer 20 is also tied with computer 18 by means of a suitable interfacing agency, which is so constructed and arranged that spectrum analyzer 20 receives the information on the desired signal and is then able to display the analysis of the proper signal. Once the output signal is maximized, then the power setting is saved for that test so that it may be automatically utilized later as necessary. (The term "automatically" is meant to include initiation by a software computer control, which may be the result of control action by an operator to turn on the computer control function.) The operator continues the above-described power up routine for each test signal of the run and can also continue for each run of the test plan. Once the power settings for a run are completed, ship 22 is contacted and the signals are broadcast. If the ship requires power setting changes to maximize its received signal, the operator of outboard system 10 will return to the power settings routine.

The present invention preferably provides compatibility with data input formats such as Excel spreadsheets and provides ease of use and easily recognizable user interfaces. Thus, for instance, all data such as signals, RF settings, bandwidths, power, antennas, patches, and the like is available for all frequencies, which may often be in the range of two to three hundred frequencies. Outboard system 10 permits a test run to be easily and quickly repeated. Once the power settings have been saved for a particular patch, the operator only needs to call up the run to be repeated without needing to repeat the power up routine thereby saving considerable time.

In FIG. 3, the basic elements of a software computer control 40 in accord with the present invention are provided to permit computer 18 to help regulate the outboard radio signal test. For a given shipboard calibration, a test plan may be generated and maintained as indicated at 42. As indicated above, the test plan may be automatically generated from the data concerning frequencies required, bandwidths, number of available antennas, and the like to most efficiently provide test signals. The test plan can be printed out, saved, and the like as desired. Resident data 46 includes specification data concerning the various equipment available at outboard facility 10. For example, this resident data includes the earlier mentioned bandwidth capabilities of RF amplifiers 14, needed in order to select and set a match of the elements of a patch interconnection for a desired range of signal frequencies. For instance, the capabilities of each of the signal generators is stored so that the proper signal generator can be matched to the required frequencies. Calibration 50 may include steps such as editing antenna information, starting calibration, and adding runs to the plan.

It is to be appreciated that during a given run (circling maneuver) of a client ship, the test plan may and usually does provide for the simultaneous broadcast by all or a subset of the plurality of antennas 12. However, during a given run, each broadcasting antenna will only broadcast a single frequency signal. Also, a given test plan may and usually does provide for the automatic performance (as earlier defined to include operator action initiated computer control) of a sequence of a plurality of runs.

Thus, system 10 of the present invention provides a means for more efficiently providing direction finding test signals to ships such as ship 22 even when the required set of frequencies, bandwidths, power levels, and the like may be quite extensive. It will be understood for purposes of the present invention that computer 18 could be a dedicated workstation, or could represent a networked group of antennas, or other computer facilities.

To briefly summarize operation, the ship provides the test facility of system 10 with a plurality of signal frequencies for testing the direction finding antenna system of the ship. A test plan is generated based on the capabilities of system 10, that includes the test signal frequencies and the bandwidths. The test plan efficiently orders the signal transmissions into runs related to the circular maneuvers of ship 22. The computer generates patch interconnections of the physical equipment available to produce the necessary signals. The computer automatically powers the selected patch interconnections as the operator preferably controls the power utilizing computer screen power controls while viewing the spectrum analyzer. All test information is stored so that it may be repeated rapidly and efficiently during testing procedures as the runs are made using the appropriate patch interconnections.

Therefore, it will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A method for testing a ship direction finding antenna system for a client ship utilizing an outboard facility while said client ship maneuvers around a circular course disposed in a predetermined position relative to said outboard facility, said method comprising:

entering into a memory of said outboard facility a list of radio frequency signals which said client ship desires in order for said client ship to calibrate said ship direction finding antenna system;

determining a test plan for transmitting a plurality of radio frequency signals comprising said list of radio frequency signals from said outboard facility with respect to said client ship and said circular course;

making at least one patch interconnection between a selected of a plurality of signal generators of said outboard facility, a selected of a plurality of radio frequency amplifiers of said outboard facility, and a selected of said plurality of antennas at said outboard facility, said at least one patch interconnection being operable for producing said plurality of radio frequency signals from said list of radio frequency signals which said client ship desires;

providing a computer screen with visual indicators to indicate a power setting for power control of said at least one patch interconnection;

utilizing said visual indicators to increase a signal power produced by said at least one patch interconnection while monitoring a spectrum analyzer to produce an optimum signal power for each radio frequency signal of said plurality of radio frequency signals; and storing said optimum signal power for each radio frequency signal of said plurality of radio frequency signals with respect to said at least one patch interconnection.

2. The method of claim 1 further comprising establishing contact with said client ship and broadcasting said list of radio frequency signals utilizing said stored optimum power signals.

3. The method of claim 1 wherein said computer screen displays details of said at least one patch interconnection.

4. The method of claim 3 wherein said computer screen displays a slide bar for indicating a level of said signal power.

5. The method of claim 4 further comprising entering into said memory of said outboard facility a list of said plurality of antennas, said plurality of radio frequency amplifiers and their bandwidth capabilities, and said plurality of signal generators.

6. The method of claim 5 further comprising providing that said test plan is optimized to reduce the amount of circling maneuvers required by said client ship.

7. The method of claim 6 further comprising matching frequencies available from said plurality of signal generators to said list of radio frequency signals.

8. The method of claim 7 further comprising matching the bandwidth capabilities of said radio frequency amplifiers to said list of radio frequency signals.

9. The method of claim 8 further comprising automatically generating said test plan.

10. The method of claim 9 further comprising automatically generating said at least one patch interconnection.

11. An outboard facility for use with a client ship when calibrating a ship direction finding antenna system as said client ship maneuvers around a circular course, said client ship requiring a plurality of signals described by a list of frequencies, said outboard facility comprising:

a plurality of signal generators, said plurality of signal generators being operable for producing generated signals at a plurality of frequencies;

a plurality of radio frequency amplifiers with variable gains for amplifying said generated signals, said plurality of radio frequency amplifiers being selectively interconnectable with each of said plurality of signal generators;

a plurality of antennas which are operable to broadcast signals to said client ship, said plurality of antennas being selectively interconnectable with each of said plurality of radio frequency amplifiers;

a spectrum analyzer operable for monitoring said plurality of antennas;

a computer control, said computer control being operable for storing said list of frequencies, said computer control being operable for storing a selected patch interconnection of a selected one of said plurality of signal generators to a selected one of said plurality of radio frequency amplifiers and to a selected one of said plurality of antennas;

a computer screen with a visual indicator for displaying the power level applied to a patch interconnection, said visual indicator being selectively controllable for producing an optimum signal power as determined by the output indicated by said spectrum analyzer for a respective frequency signal of said list of frequencies, said computer control being operable for storing said optimum signal power for said list of frequencies.

12. The outboard facility of claim 11 wherein said computer control is operable for storing a test plan comprised of a plurality of selected patch interconnections and to simultaneously broadcast a plurality of frequencies of said list of frequencies for said client ship, said simultaneously broadcast frequencies each respectively being broadcast through different antennas of said plurality of antennas while said client ship maneuvers around said circular course.

13. The outboard facility of claim 12 wherein said computer control is operable for monitoring editing of said test plan by an operator to verify that said test plan remains operable for broadcasting said list of frequencies after said editing.

14. The outboard facility of claim 13 wherein said computer control is operable for storing data related to capabilities of said plurality of signal generators, said plurality of radio frequency amplifiers, and said plurality of antennas.

15. The outboard facility of claim 14 wherein said computer control is operable for producing said test plan by matching said list of frequencies with said capabilities of said plurality of signal generators, said plurality of radio frequency amplifiers, and said plurality of antennas.

16. The outboard facility of claim 15 wherein said computer control is operable for storing a plurality of test plans.

17. The outboard facility of claim 12 wherein said computer control is further operable for storing a test plan for one or more succeeding patch interconnections, each succeeding patch interconnection being operable to broadcast at least one different frequency of said list of frequencies, and said computer control is still further operable to automatically broadcast at least one frequency for each selected one or more succeeding patch interconnections during corresponding succeeding circular maneuvers of said client ship.

* * * * *